US012618138B2

(12) United States Patent
Bredberg et al.

(10) Patent No.: US 12,618,138 B2
(45) Date of Patent: May 5, 2026

(54) ANTI-REFLECTIVE COATINGS FOR IR-TRANSMITTING SUBSTRATES

(71) Applicant: CORNING INCORPORATED, Corning, NY (US)

(72) Inventors: Nicholas Levi Bredberg, Jaffrey, NH (US); Lance Changyong Kim, Rindge, NH (US); Yongli Xu, Keene, NH (US)

(73) Assignee: CORNING INCORPORATED, Corning, NY (US)

( * ) Notice: Subject to any disclaimer, the term of this patent is extended or adjusted under 35 U.S.C. 154(b) by 641 days.

(21) Appl. No.: 18/078,207

(22) Filed: Dec. 9, 2022

(65) Prior Publication Data

US 2023/0193452 A1 Jun. 22, 2023

Related U.S. Application Data

(60) Provisional application No. 63/292,045, filed on Dec. 21, 2021.

(51) Int. Cl.
C23C 14/06 (2006.01)
C23C 14/22 (2006.01)
(52) U.S. Cl.
CPC ........ C23C 14/0694 (2013.01); C23C 14/221 (2013.01)
(58) Field of Classification Search
CPC .................... C23C 14/0694; C23C 14/221
See application file for complete search history.

(56) References Cited

U.S. PATENT DOCUMENTS

| 4,910,401 | A | 3/1990 | Woods |
| 5,493,126 | A | 2/1996 | Taylor et al. |
| 6,569,917 | B1 | 5/2003 | Moszner et al. |
| 6,919,988 | B2 | 7/2005 | Cook |
| 7,345,277 | B2 | 3/2008 | Zhang |
| 7,629,582 | B2 | 12/2009 | Hoffman et al. |
| 8,274,027 | B2 | 9/2012 | Andressen et al. |
| 8,279,520 | B2 | 10/2012 | Moskun et al. |
| 9,056,043 | B2 | 6/2015 | Joly et al. |
| 9,320,685 | B2 | 4/2016 | Moser et al. |
| 9,348,120 | B2 | 5/2016 | Huddleston |
| 9,410,030 | B2 | 8/2016 | Joly et al. |
| 9,463,146 | B2 | 10/2016 | Fornof et al. |
| 9,532,929 | B2 | 1/2017 | Fornof et al. |

(Continued)

OTHER PUBLICATIONS

Zhang et al. ("Determination of infrared refractive index of ZnS and YbF3 thin films by spectroscopy." Optik 170 (2018): 321-327.) (Year: 2018).*

(Continued)

*Primary Examiner* — Ricardo D Morales
(74) *Attorney, Agent, or Firm* — Kevin L. Bray

(57) ABSTRACT

Optical elements including $YbF_3$ layers with high transmittance in the LWIR spectral range are described. The $YbF_3$ layer is produced by an ion-assisted deposition process under high voltage conditions. Dense, uniform, and nearly defect-free $YbF_3$ layers are formed. The improved material quality of the $YbF_3$ layers leads to low absorption in the LWIR spectral range, especially at wavelengths above 10.0 microns. The extinction coefficient of the $YbF_3$ layers is less than 0.0400 at a wavelength of 13.5 microns.

15 Claims, 12 Drawing Sheets

(56)          References Cited

U.S. PATENT DOCUMENTS

| | | | |
|---|---|---|---|
| 9,548,415 B1 | 1/2017 | Son | |
| 9,706,140 B2 | 7/2017 | Haldeman et al. | |
| 9,730,864 B2 | 8/2017 | Fornof et al. | |
| 9,812,595 B1 | 11/2017 | Son | |
| 9,832,396 B2 | 11/2017 | Haldeman et al. | |
| 9,891,414 B2 | 2/2018 | Huddleston | |
| 9,924,138 B1 | 3/2018 | Brown | |
| 9,963,773 B2 | 5/2018 | Schreiber et al. | |
| 10,203,483 B2 | 2/2019 | Huddleston | |
| 10,330,929 B2 | 6/2019 | Sitter, Jr. | |
| 10,479,848 B2 | 11/2019 | Moser et al. | |
| 10,483,416 B2 | 11/2019 | Rana et al. | |
| 10,553,799 B2 | 2/2020 | Park et al. | |
| 10,591,706 B2 | 3/2020 | Huddleston | |
| 10,633,585 B2 | 4/2020 | Kim et al. | |
| 10,797,250 B2 | 10/2020 | Kim et al. | |
| 10,804,467 B2 | 10/2020 | Kim et al. | |
| 10,873,040 B2 | 12/2020 | Jeon et al. | |
| 10,954,254 B2 | 3/2021 | Ahn et al. | |
| 11,111,320 B2 | 9/2021 | Moser et al. | |
| 2013/0135741 A1* | 5/2013 | Lee | C23C 14/505 |
| | | | 118/500 |
| 2018/0299587 A1* | 10/2018 | Aitken | C03C 17/3605 |

OTHER PUBLICATIONS

S Mohan, et al., "A review of ion beam assisted deposition of optical thin films", Vaccum, vol. 46, No. 7, 1995, pp. 645-659.

* cited by examiner

300A

ANTI-REFLECTIVE COATINGS FOR IR-TRANSMITTING SUBSTRATES

This application claims the benefit of priority under 35 U.S.C § 120 of U.S. Provisional Application Ser. No. 63/292,045 filed on Dec. 21, 2021, the content of which is relied upon and incorporated herein by reference in its entirety.

FIELD

The present disclosure generally relates to optical elements with high transmission in the infrared and to methods of making the optical elements. Particularly, the present disclosure relates to optical elements containing infrared-transmitting substrates and anti-reflective coatings that exhibit high transmission in the long wavelength infrared (LWIR) portion of the electromagnetic spectrum. More particularly, the present disclosure relates to anti-reflective coatings exhibiting low absorption at wavelengths above 10.0 microns.

BACKGROUND

The optical elements (lenses, windows, mirrors etc.) used in many types of optical instruments, telescopes, cameras, airborne detectors, satellite cameras, surveillance cameras, and missile domes typically include substrates and optical coatings designed to satisfy optical specifications needed to ensure acceptable performance for a particular application.

Optical elements that are compatible with wavelengths in the atmospheric transmission window are important for many applications. FIG. 1 shows a transmission spectrum of the earth's atmosphere over a wavelength range extending up to 15 microns. The approximate absorption wavelengths of common atmospheric gases are also indicated. Optical communication and detection systems that operate over extended distances through the earth's atmosphere require optical elements that are compatible with wavelengths of high transmission through the earth's atmosphere. FIG. 1 depicts several such wavelength ranges. The region extending from 8 microns to 14 microns (referred to herein as the "LWIR" or "long wavelength infrared" region of the spectrum) offers many wavelengths of high transmission for optical communication and detection, but is a demanding region in which to operate because of the difficulty of identifying suitable materials for optical elements.

Optical elements needed for optical communication and detection in the LWIR region include lenses and windows. The performance of optical elements in the LWIR requires high transmission of LWIR wavelengths. High transmission requires both high internal transmission and low surface reflection of the materials used to make optical elements for LWIR applications. Materials such as ZnS, ZnSe, InSb, Ge, $As_{40}Se_{60}$, $Ge_{10}Se_{50}As_{40}$, $Ge_{28}Sb_{12}Se_{60}$, and $Ge_{33}Se_{55}As_{12}$ are known to exhibit high transmittance over at least portions of the LWIR region. These materials, however, exhibit high reflection of LWIR wavelengths, leading to a deterioration of overall performance. To improve LWIR performance, a material with high internal transmittance (referred to herein as an "infrared-transmitting material") can be used as a substrate and an anti-reflection (AR) coating can be applied to the surface of the infrared-transmitting material to form an optical element.

Anti-reflection coatings consist of a stack of alternating high index layers and low index layers. Each of the high index layer and low index layer must exhibit low absorption over the wavelength range of operation (e.g. LWIR region) of the optical element to maximize the transmission of LWIR wavelengths through the optical element. Suitable substrate materials have low absorption in the LWIR region and can also function as a material for the high index layer in an anti-reflection coating.

It has heretofore proved challenging, however, to identify a suitable material for the low index layer of anti-reflection coatings for the LWIR region. Oxides are not suitable because they exhibit strong absorption in the LWIR region. Alkali halides such as CsI, KBr, KCl, NaCl, thallium bromoiodide (e.g. KRS-5) have low absorption in the LWIR region, but because of sensitivity to moisture and poor mechanical properties, they are not acceptable. KRS-5 has favorable transmission properties, but it is soft, toxic, and expensive. Fluorides are the only practical class of materials that can be used as the material for the low index layers of an anti-reflection coating in the LWIR region. LiF, for example, can transmit at wavelengths up to 30 microns, but it is not widely used because of its poor mechanical properties and high cost. Other common fluorides (e.g. $CaF_2$, $MgF_2$) are limited to wavelengths below 10 microns because the intrinsic absorption increases significantly at wavelength longer than 10 microns.

$YbF_3$ is a promising material for the low index layer of anti-reflection coatings in the LWIR region. Because Yb is a heavier element than Ca and Mg, the intrinsic absorption of $YbF_3$ shifts to about 15 microns, thus offering the potential of high transmittance at wavelengths well above 10 microns. In practice, however, the measured absorption of $YbF_3$ between 10 microns and 15 microns is relatively high and applications of $YbF_3$ in the LWIR region have been limited to wavelengths below 10 microns.

There is accordingly a need for improved materials for use as a low index layer in anti-reflection coatings for optical elements that operate in the LWIR region.

SUMMARY

Optical elements including coatings including fluoride layers with high transmittance in the LWIR spectral range are described. The coatings are preferably anti-reflection coatings containing one or more high index layers and one or more low index layers. A preferred low index layer is $YbF_3$. The $YbF_3$ layer is produced by an ion-assisted deposition process under high voltage conditions. Dense, uniform, and nearly defect-free $YbF_3$ layers are formed. The improved material quality of the $YbF_3$ layers leads to low absorption and low extinction coefficients in the LWIR spectral range, especially at wavelengths above 10.0 microns.

The present disclosure extends to:

An optical element comprising:

a substrate; and a coating in contact with the substrate, the coating comprising a layer of $YbF_3$, the layer of $YbF_3$ having an absorption less than 2.2%/micron at a wavelength of 13.5 microns.

The present disclosure extends to:

A method of making an optical element comprising:

forming a fluoride layer on a substrate, the forming comprising depositing the fluoride layer using an ion-assisted deposition process, the ion-assisted deposition process comprising subjecting a source material for the fluoride layer to an ion source, the ion source configured to operate at a voltage greater than 120 V.

These and other aspects, objects, and features of the present disclosure will be understood and appreciated by those skilled in the art upon studying the following specification, claims, and appended drawings.

DETAILED DESCRIPTION

Figure 1:
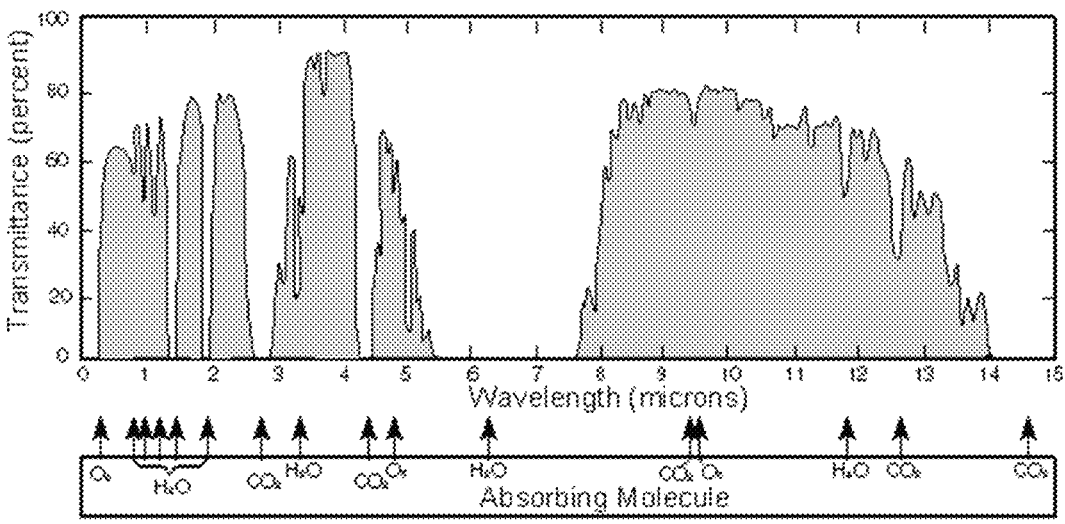
FIG. 1 shows a transmission spectrum of the earth's atmosphere over a selected wavelength range and approximate absorption wavelengths of common gases present in the earth's atmosphere.

In the following detailed description, for purposes of explanation and not limitation, example embodiments disclosing specific details are set forth to provide a thorough understanding of various principles of the present disclosure. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

In this disclosure, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

In this specification and in the claims that follow, reference will be made to a number of terms which shall be defined to have the following meanings.

"Include," "includes," or like terms means encompassing but not limited to, that is, inclusive and not exclusive.

The indefinite article "a" or "an" and its corresponding definite article "the" as used herein means at least one, or one or more, unless specified otherwise.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The term "formed from" means one or more of comprises, consists essentially of, or consists of. For example, a component that is formed from a particular material can comprise the particular material, consist essentially of the particular material, or consist of the particular material.

As used herein, contact refers to direct contact or indirect contact. Direct contact refers to contact in the absence of an intervening material and indirect contact refers to contact through one or more intervening materials. Elements in direct contact touch each other. Elements in indirect contact do not touch each other, but are otherwise joined to each other through one or more intervening elements. Elements in contact may be rigidly or non-rigidly joined. Contacting refers to placing two elements in direct or indirect contact. Elements in direct (indirect) contact may be said to directly (indirectly) contact each other.

The terms "on" or "disposed on" refers to direct or indirect contact. If one layer is referred to herein as being on or disposed on another layer, the two layers are in direct or indirect contact. The terms "directly on" or "directly disposed on" means that the two layers are in direct contact.

The term "index" refers to refractive index and is given the symbol "n", where refractive index means the refractive index at a wavelength of 10.0 microns. Refractive index as used herein refers to the real part of the complex refractive index. The imaginary part of the complex refractive index is referred to herein as the "extinction coefficient" and is given the symbol "k".

The term "layer" refers to a region of a material that is compositionally homogeneous and is intended to encompass the entirety of the dimensions of a compositionally homogeneous region of material and not constituent portions thereof. By way of example, if a region of $YbF_3$ has a thickness of 1 microns, the term layer when used in reference to the region of $YbF_3$ refers to the thickness of 1 micron. For purposes of the present disclosure, such region of $YbF_3$ is not to be regarded as a plurality of layers, each of which has a thickness less than 1 micron (such as, for example, two layers, each having a thickness of 0.5 microns).

The term "high index layer" refers to a layer having a refractive index greater than or equal to 1.8.

The term "low index layer" refers to a layer having a refractive index less than 1.8.

The term "alternating" is used to refer to layers arranged in an alternating sequence. For example, if (H) denotes a high index layer of a particular composition and (L) denotes a low index layer of a particular composition, a two-layer sequence of the high index layer and the low index layer can be written "(H)(L)". Two such sequences can be written as the sequence "(H)(L)(H)(L)" and an arbitrary number of such sequences can be written " . . . (H)(L) . . . " or "((H)(L))$_n$". In the sequence of layers " . . . (H)(L)(H)(L)

(H)(L) . . . ", for example, the layers (H) and (L) are said to be alternating, whereas in the series " . . . (H)(L)(L)(H) . . . ", the layers (H) and (L) are not alternating. Layers of a given type (e.g. (H) or (L)) in an alternating sequence have the same composition, but may differ in thickness.

The term "LWIR" means "long wavelength infrared" and refers to the region of the electromagnetic spectrum in the wavelength range from 7.5 microns to 13.5 microns.

The term "ion-assisted deposition" (also referred to herein as "IAD") refers to a film deposition process in which a film material (e.g. layer) is evaporated from a source material by thermal means or by electron beam for deposition onto a substrate in which the depositing film is simultaneously bombarded with ions from an ion source. Ion-assisted deposition performed by operating the ion source at a voltage less than or equal to 120 V is referred to as "conventional" or "conventional IAD". Ion-assisted deposition performed by operating the ion source at a voltage greater than 120 V is referred to as "modified" or "modified IAD". Examples of ion-assisted deposition include magnetron sputtering, RF (radiofrequency) sputtering, ion beam sputtering, activated reactive evaporation, ion plating, ion beam cluster deposition and ion beam mixing. A description of ion-assisted deposition is given by S. Mohan and M Ghanashyam Krishna, "A review of ion beam assisted deposition of optical thin film", Vacuum, vol. 46 (7), pp. 645-659 (1995).

Reference will now be made in detail to illustrative embodiments of the present description.

The present description provides optical elements that exhibit high transmittance in the infrared spectral region and in particular, in the LWIR region. The optical elements can, for example, be a component of a window or lens of an optical system, surveillance camera, telescope, missile dome, airborne detector, satellite camera, camera, infrared detector, telescope, etc. The optical elements include a substrate and a coating in contact with the substrate. In one embodiment, the coating is an anti-reflection coating. In one embodiment, the anti-reflection coating includes a series of alternating high index layers and low index layers.

Figure 2:
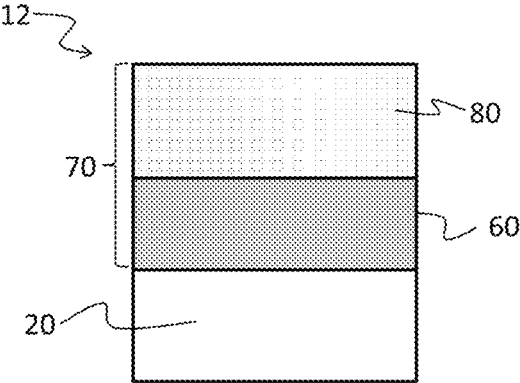
FIG. 2 depicts an embodiment of an optical element having a substrate and a two-layer anti-reflection coating.

FIG. 2 shows a schematic of an optical element 12 that includes substrate 20 and anti-reflection coating 70 directly on substrate 20. In the embodiment of FIG. 2, anti-reflection coating 70 is a two-layer coating that includes layer 60 and layer 80. Layer 60 is in direct contact with substrate 20 and layer 80 is in indirect contact with substrate 20. In one embodiment, layer 60 has a higher refractive index than layer 80. In another embodiment, layer 60 has a lower refractive index than layer 80. The combination of layer 60 and layer 80 is a two-layer period and anti-reflection coating 70 includes a single period.

Figure 3:
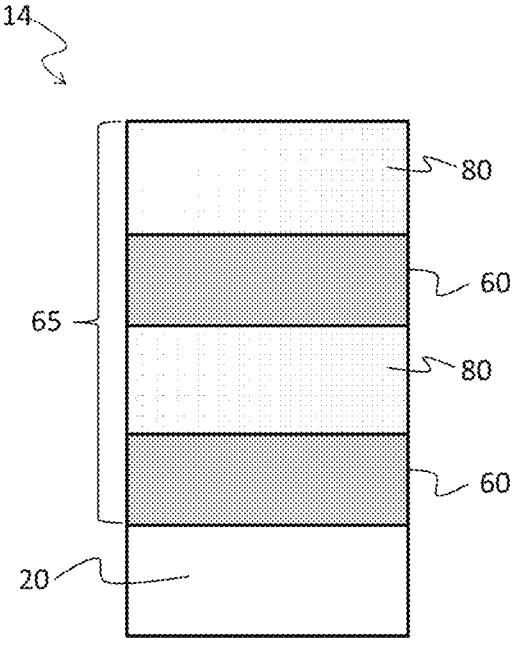
FIG. 3 depicts an embodiment of an optical element having a substrate and a four-layer anti-reflection coating.

FIG. 3 shows an optical element 14 that includes substrate 20 and anti-reflection coating 65 directly on substrate 20. In the embodiment of FIG. 3, anti-reflection coating 65 is a four-layer coating that includes two periods. Each period includes layer 60 and layer 80. In one embodiment, layer 60 has a higher refractive index than layer 80. In another embodiment, layer 60 has a lower refractive index than layer 80. In the embodiment of FIG. 3, one of layers 60 is in direct contact with substrate 20 and the other of layers 60 is in indirect contact with substrate 20. Both layers 80 are in indirect contact with substrate 20. In another embodiment, layer 60 has a lower refractive index than layer 80. Anti-reflection coatings with any number of periods, such as with three or more periods or four or more periods etc., are also within the scope of the present disclosure.

Figure 4:
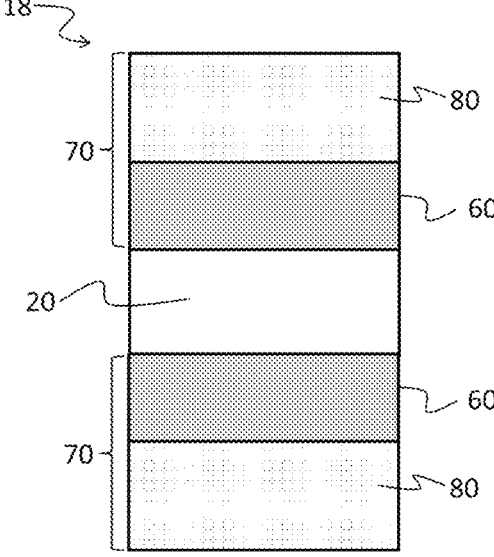
FIG. 4 depicts an embodiment of an optical element having a substrate that includes an anti-reflection coating on opposing surfaces.

FIG. 4 shows an optical element 18 that includes an anti-reflection coating 70 directly on opposing sides of a substrate 20. Optical element 18 includes substrate 20. Anti-reflection coating 70 is formed directly on opposing surfaces of substrate 20. In the embodiment shown in FIG. 4, the anti-reflection coating 70 is the same on each side of substrate 20. In other embodiments, one or more of the properties (e.g. composition, thickness, number, period structure) of the anti-reflection coating is different on different surfaces of substrate 20. In one embodiment, layer 60 has a higher refractive index than layer 80. In another embodiment, layer 60 has a lower refractive index than layer 80. In the embodiment of FIG. 4, layers 60 are in direct contact with substrate 20 and layers 80 are in indirect contact with substrate 20.

In the embodiments depicted in FIGS. 2-4, the anti-reflection coating is in direct contact with the substrate. In other embodiments, the anti-reflection coating is in indirect contact with the substrate. In one embodiment, an adhesion layer is positioned between the substrate and the anti-reflection coating. For example, an adhesion layer may be in direct contact with the substrate and the anti-reflection coating may be in direct contact with the adhesion layer. Adhesion layers may also be positioned between periods of a stack consisting of repeating periods. Adhesion layers act to improve the strength of adhesion between the anti-reflection coating and the substrate. Adhesion layers include Si, Ge, Se, ZnSe, $Ga_2Se_3$, $Bi_2Se_3$, $In_2Se_3$, $Ga_2S_3$, ZnS, and $In_2S_3$.

The substrate is a material with low absorption in the LWIR region. In embodiments, the substrate has an absorption at each wavelength in the LWIR region of less than 10%/mm, or less than 5%/mm, or less than 2%/mm, or less than 10%/mm, or less than 0.5%/mm where "%/mm" refers to percent per millimeter thickness. Preferred substrates include ZnS, ZnSe, Ge, InSb, chalcogenide glasses, $As_{40}Se_{60}$, $Ge_{10}Se_{50}As_{40}$, $Ge_{28}Sb_{12}Se_{60}$, and $Ge_{33}Se_{55}As_{12}$.

The anti-reflection coating includes one or more high index layers and one or more low index layers. Either of a high index layer or a low index layer can be directly disposed on the substrate or directly disposed on an adhesion layer in direct contact with the substrate. Preferred high index layers include ZnS (n=2.20) and ZnSe (n=2.41). Preferred low index layers include $YbF_3$ (n=1.38), other rare earth fluorides (e.g. $LaF_3$, $GdF_3$), and transition metal fluorides (e.g. $YF_3$). In one embodiment, the anti-reflection coating includes a single high index layer and a single low index layer. In another embodiment, the anti-reflection coating includes a plurality of high index layers and a plurality of low index layers. The composition and/or thickness may be the same or different for the high index layers of the plurality of high index layers. The composition and/or thickness may be the same or different for the low index layers of the plurality of low index layers. In yet another embodiment, the anti-reflection coating includes alternating high index layers and low index layers (e.g. . . . (H)(L)(H)(L) . . . or . . . (L)(H)(L)(H) . . . ). In a further embodiment, the anti-reflection coating has a periodic layer structure that includes one or more periods, where each period includes a high index layer and a low index layer. Preferred periods include (ZnS)($YbF_3$) and (ZnSe)($YbF_3$). The composition and/or thickness of the high index layer may be the same or different in each of two or more periods. The composition and/or thickness of the low index layer may be the same or different in each of two or more periods. The number of periods in the coating is one or more, two or more, three or more, four or more, five or more, or in the range from 1-20, or in the range from 2-15, or in the range from 3-10.

The thickness of each of the one or more high index layers in the anti-reflection coating is in the range from 0.005 micron to 10.0 microns, or in the range from 0.010 micron to 9.0 microns, or in the range from 0.050 micron to 8.0 microns, or in the range from 0.100 micron to 6.0 microns, or in the range from 0.300 micron to 5.0 microns, or in the range from 0.500 micron to 4.0 microns. The thickness of each of the one or more low index layers in the anti-reflection coating is in the range from 0.005 micron to 10.0 microns, or in the range from 0.010 micron to 9.0 microns, or in the range from 0.050 micron to 8.0 microns, or in the range from 0.100 micron to 6.0 microns, or in the range from 0.300 micron to 5.0 microns, or in the range from 0.500 micron to 4.0 microns.

EXAMPLES

The following examples describe various features and advantages provided by the disclosure, and are in no way intended to limit the invention and appended claims. A A comparative example using a conventional ion-assisted deposition process is first described to illustrate deficiencies associated with current anti-reflection coatings. Several embodiment examples using a modified ion-assisted deposition process are then described to demonstrate unexpected improvements in the performance of anti-reflection coatings. In particular, a significant reduction in the absorption of the anti-reflection coating at wavelengths near 6.0 microns and at wavelengths greater than 10.0 microns is demonstrated. The anti-reflection coatings disclosed herein thus extend the range of performance in the LWIR region to longer wavelengths than has heretofore been possible.

Experimental Technique

Ion-assisted deposition was used to prepare comparative examples of $YbF_3$ layers and embodiment examples of $YbF_3$ layers. Ion-assisted deposition was used to deposit layers of $YbF_3$ from a source material of $YbF_3$ in all of the examples. The ion-assisted deposition was accomplished in a deposition chamber equipped with three thermal sources and an electron beam source. The thermal and electron beam sources were available to initiate evaporation or ejection of $YbF_3$ from the $YbF_3$ source materials for deposition of $YbF_3$ layers onto a substrate to form optical elements. Substrates included ZnSe, Ge, and InSb. The deposition chamber was also equipped with an ion source (Veeco Mark II™). The ion source was capable of delivering an ion current up to 10 A at voltages up to 300 V. The ion source was positioned about 32 inches from the deposition surface of the substrate and oriented at an angle of about 350 from the normal to the deposition surface of the substrate. The ion current and voltage could be controlled independently and various combinations of current and voltage were used to prepare the comparative example and embodiment examples. All IAD depositions of $YbF_3$ were conducted in the presence of Ar (argon). The Ar flow rate depended slightly on the ion current and voltage selected for the ion source, but was typically 20-30 sccm (standard cubic centimeters per second).

Substrates were cleaned with a rinse of deionized water, soaking in a cleaning solution (Dilute Surface Cleanse/930) and drying. The substrates were then placed in the deposition chamber for further cleaning by ion etching using the ion source. The chamber pressure was reduced to $10^{-6}$ Torr or lower and the substrate surface was subjected to bombardment with ions from the ion source for cleaning by ion etching. The ion source was operated at an ion current of 6

A and a voltage of 75 V for the ion etching. The ion etching was performed under a flow of 50 sccm of Ar (argon).

To deposit layers of $YbF_3$ in the examples that follow, thermal evaporation of a $YbF_3$ source material (99.99% purity, density of 8.7 g/cm³, melting point of 1150° C.) was used. The rate of thermal evaporation was controlled to provide a layer deposition rate of 3-10 Å/s (typically about 5 Å/s). Ion assistance (bombardment of the depositing layer with ions from the ion source) was performed throughout deposition. The ion current and voltage were varied as described below to form layers of $YbF_3$ to investigate the effect of IAD deposition conditions on the absorption of $YbF_3$ in the LWIR region.

To deposit layers of ZnSe in the examples that follow, a ZnSe source material was placed in a boat positioned in the deposition chamber and evaporated by resistive heating. During deposition of a ZnSe layer onto a $YbF_3$ layer, the ion source was turned off and deposition of the ZnSe layers occurred without ion assistance. The rate of deposition of ZnSe was typically about 6 Å/s. An optional layer of ZnSe may be deposited onto the substrate before deposition of any of the $YbF_3$ layers to condition the substrate surface and/or improve adhesion.

Absorption, transmittance, extinction coefficient, and reflectance were measured using a Nicolet 6800 FTIR instrument (Thermal Scientific). The measured values obtained for absorption, transmittance, and reflectance are reported on a percent basis. Measured values shown in the data plots correspond to deposited thickness of the layers. Values normalized to unit thickness are given as noted below.

Comparative Example—Single Layer of $YbF_3$ Prepared by Conventional IAD Technique Ion-assisted deposition under conventional IAD conditions was used to form a layer of $YbF_3$ on a ZnSe substrate. The ZnSe substrate was a commercial wafer (available from Novotech, Inc. or II-VI Incorporated) with a diameter of 1 inch and a thickness of 3 mm. The ion source was operated at an ion current of 6 A and a voltage of 75 V. A conventional $YbF_3$ layer having a thickness of 2.68 microns was formed.

Figure 5:
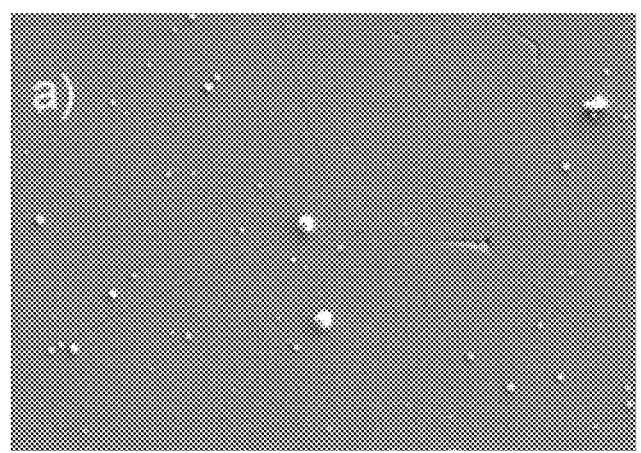
FIG. 5 shows the surface morphology of a $YbF_3$ layer formed by ion-assisted deposition under conventional ion current and voltage conditions.
Figure 6:
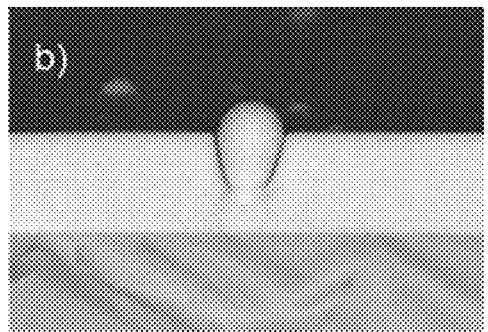
FIG. 6 shows a cross-sectional image of a particulate defect of a conventional $YbF_3$ layer.
Figure 7:
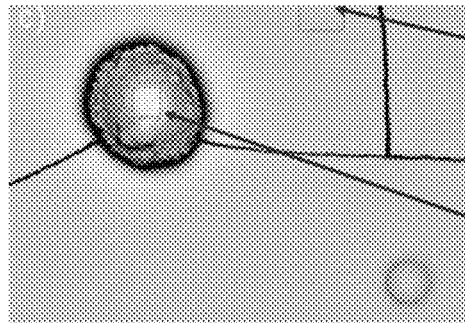
FIG. 7 shows an enlargement in plan view of a particulate defect of a conventional $YbF_3$ layer.

FIG. 5 shows an image of the surface morphology of the conventional $YbF_3$ layer. The image shows the presence of particulates, cracks and other defects on the surface. An enlargement of representative particulates is shown in cross-section in FIG. 6 and in plan view in FIG. 7. The presence of defects suggests that the $YbF_3$ layer prepared by the conventional IAD technique is in a state of high stress and of low quality. As described more fully hereinbelow, $YbF_3$ layers formed under conventional ion-assisted deposition conditions exhibit strong absorption at wavelengths greater than 10 microns and has limited utility in the LWIR region.

Embodiment Examples—Single Layer of $YbF_3$ Prepared by Modified IAD Technique To improve the quality of $YbF_3$ layers, conditions of ion-assisted deposition were altered. In particular, operation of the ion source at a voltage greater than 100 V was shown to reduce the presence of defects and to form $YbF_3$ layers with smooth surface morphology. Tables 1 and 2 show conditions of ion-assisted deposition for several embodiment examples (Samples 1-10) and four comparative examples (Samples C1 and C2). Each of the samples included a layer of $YbF_3$ with a thickness of 2.68 microns on a ZnSe substrate having a diameter of 1 inch and a thickness of 3 mm. The substrate temperature for the Samples listed in Table 1 and Table 2 was 105° C. In Table 1 and Table 2, the columns labelled "Current" and "Voltage" refer to the ion current (in units of Amperes) and voltage (in units of Volts) of the ion source used in the deposition of each Sample. In Table 1 and Table 2, the column labelled "Trace" refers to the label shown in FIG. 8 and FIG. 10, respectively, that depicts the data trace corresponding to the sample.

TABLE 1

| | IAD Deposition Conditions | | |
|---|---|---|---|
| Sample | Trace | Current (A) | Voltage (V) |
| C1 | 110 | 6 | 75 |
| 1 | 120 | 8 | 120 |
| 2 | 130 | 5 | 300 |
| 3 | 140 | 6 | 250 |
| 4 | 150 | 10 | 150 |

TABLE 2

| | IAD Deposition Conditions | | |
|---|---|---|---|
| Sample | Trace | Current (A) | Voltage (V) |
| C2 | 210 | 6 | 75 |
| 6 | 220 | 5 | 300 |
| 7 | 230 | 6 | 250 |
| 8 | 240 | 10 | 150 |

Figure 8:
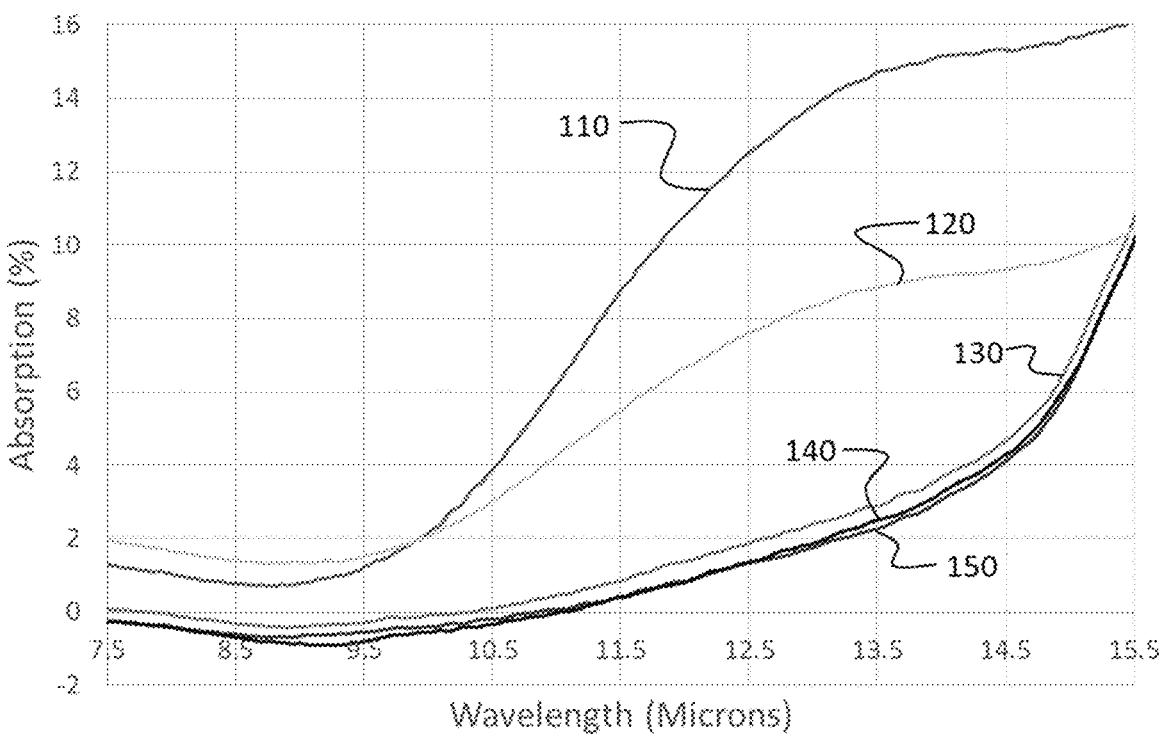
FIG. 8 shows a graph of absorption as a function of wavelength for $YbF_3$ prepared by conventional IAD and modified IAD.

FIG. 8 depicts the absorption spectra of comparative Sample C1 and Samples 1-4 over the wavelength range from 7.5 microns to 15.5 microns. The absorption of comparative Sample C1 was observed to increase significantly above a wavelength of about 9.5 microns. The strong absorption is detrimental to the performance of comparative Sample C1 for applications in the LWIR requiring high transmittance. The absorption observed for Samples 1-4 was significantly less than the absorption observed for comparative Sample C1. The results for Samples 1-4 show that absorption in the LWIR decreased under the modified high voltage IAD deposition conditions. The absorption decreased as the voltage was increased from 75 V (comparative Sample C1) to 120 V (Sample 1) and further decreased as the voltage was increased from 150 V (Sample 4). A slight increase in absorption was observed as the voltage was increased above 150 V (Samples 2 and 3).

Figure 9:
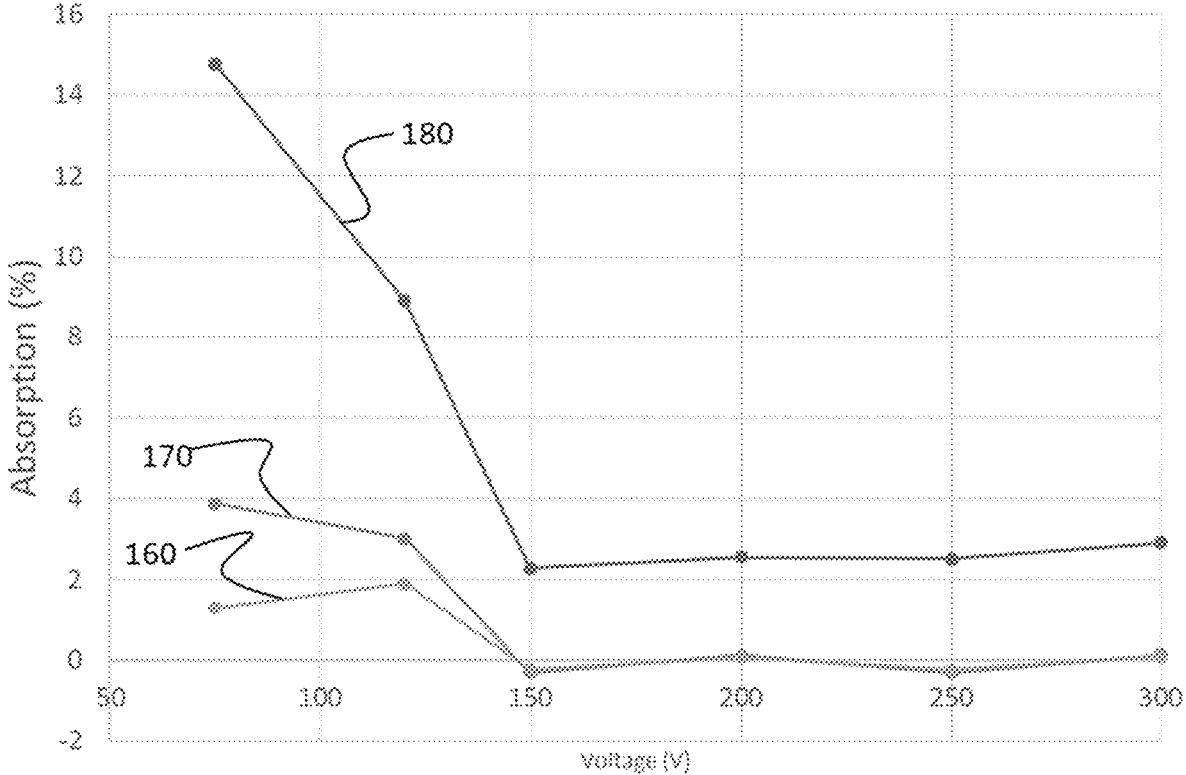
FIG. 9 shows a graph of absorption of $YbF_3$ at three wavelength as a function of the voltage of the ion source used in IAD.

FIG. 9 shows the dependence of absorption as a function of the voltage of the ion source at three different wavelengths in the LWIR. The composition ($YbF_3$), substrate (ZnSe) and thicknesses of the samples depicted in FIG. 9 correspond to those described above for Table 1 and FIG. 8. The only difference is that the current of the ion source was fixed at 10 A to illustrate more directly the effect of voltage on the absorption in the LWIR. Trace 160 shows the absorption at 7.5 microns, Trace 170 shows the absorption at 10.5 microns, and Trace 180 shows the absorption at 13.5 microns. The data in FIG. 9 show a consistent decrease in absorption in the LWIR spectral region as the voltage of the ion source was increased. The decrease was particularly pronounced at a wavelength of 13.5 microns. Such decreases in the absorption of $YbF_3$ in the LWIR have not previously been reported and the decrease at 13.5 microns was unexpected and demonstrates the superior performance of the materials disclosed herein for applications in the LWIR.

The results depicted in FIGS. 8 and 9 demonstrate layers of $YbF_3$ with thickness of 2.68 microns have an absorption of less than 2.0%, or less than 1.5%, or less than 1.0%, or less than 0.5%, or less than 0.2% at a wavelength of 7.5 microns. As is known in the art, absorption is proportional to layer thickness. When normalized to a layer thickness of 1.0 micron, the absorption of $YbF_3$ is less than 0.8%, or less than 0.6%, or less than 0.4%, or less than 0.2%, or less than 0.1% at a wavelength of 7.5 microns. That is, the absorption of $YbF_3$ is less than 0.8%/micron, or less than 0.6%/micron, or less than 0.4%/micron, or less than 0.2%/micron, or less than 0.1%/micron at a wavelength of 7.5 microns, where "%/micron" refers to % absorption per micron of thickness.

The results depicted in FIGS. 8 and 9 demonstrate layers of $YbF_3$ with thickness of 2.68 microns have an absorption of less than 2.0%, or less than 1.5%, or less than 1.0%, or less than 0.5%, or less than 0.2% at a wavelength of 10.5 microns. As is known in the art, absorption is proportional to layer thickness. When normalized to a layer thickness of 1.0 micron, the absorption of $YbF_3$ is less than 0.8%, or less than 0.6%, or less than 0.4%, or less than 0.2%, or less than 0.1% at a wavelength of 10.5 microns. That is, the absorption of $YbF_3$ is less than 0.8%/micron, or less than 0.6%/micron, or less than 0.4%/micron, or less than 0.2%/micron, or less than 0.1%/micron at a wavelength of 10.5 microns, where "%/micron" refers to % absorption per micron of thickness.

The results depicted in FIGS. 8 and 9 demonstrate layers of $YbF_3$ with thickness of 2.68 microns have an absorption of less than 6.0%, or less than 5.5%, or less than 5.0%, or less than 4.5%, or less than 4.0%, or less than 3.5%, or less than 3.0%, or less than 2.5% at a wavelength of 13.5 microns. As is known in the art, absorption is proportional to layer thickness. When normalized to a layer thickness of 1.0 micron, the absorption of $YbF_3$ is less than 2.2%, or less than 2.0%, or less than 1.9%, or less than 1.7%, or less than 1.5% at a wavelength of 13.5 microns. That is, the absorption of $YbF_3$ is less than 2.2%/micron, or less than 2.0%/micron, or less than 1.9%/micron, or less than 1.7%/micron, or less than 1.5%/micron at a wavelength of 13.5 microns, where "%/micron" refers to % absorption per micron of thickness.

Figure 10:
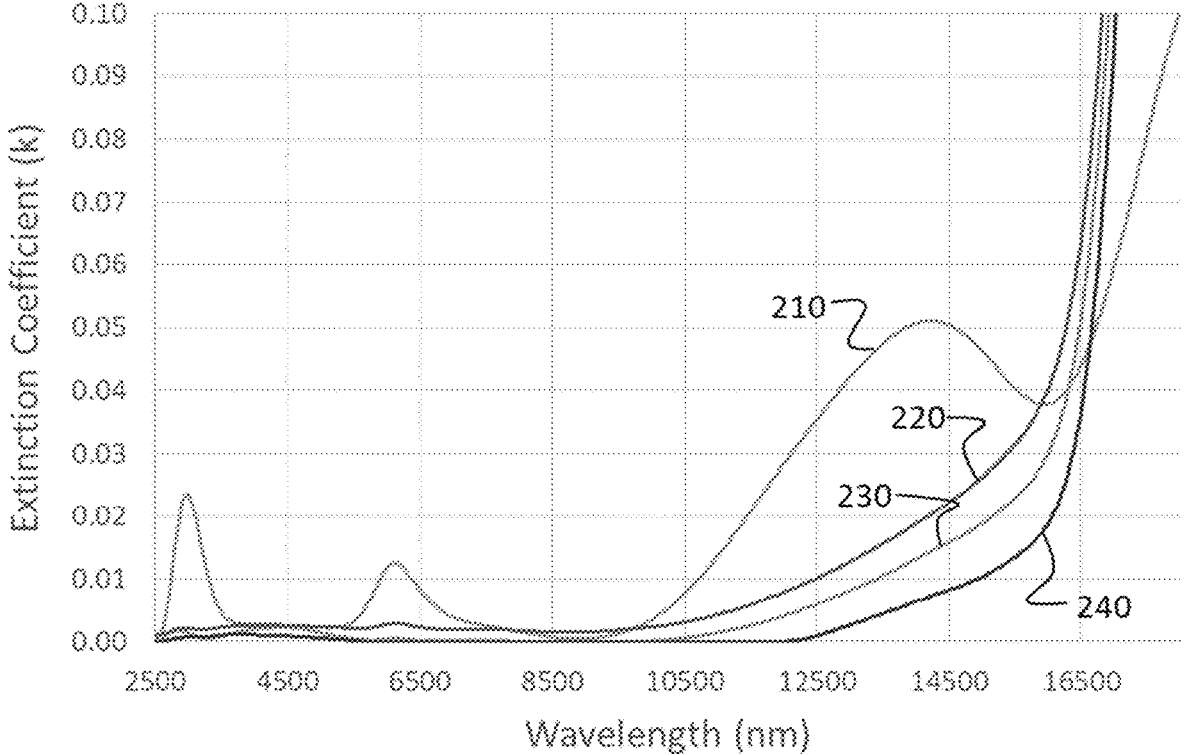
FIG. 10 shows a graph of extinction coefficient (k) as a function of wavelength for $YbF_3$ prepared by conventional IAD and modified IAD.

FIG. 10 shows the dependence of extinction coefficient (k) on wavelength for the $YbF_3$ samples listed in Table 2. Trace 210 shows the extinction coefficient (k) for comparative Sample C2, which was prepared by the conventional IAD process. Traces 220, 230 and 240 show the extinction coefficient (k) for Samples 6-8, which were prepared by the modified IAD process disclosed herein. The extinction coefficient (k) is a measure of loss of intensity of an optical signal passing through the layer due to absorption. The results indicate that high losses occur for wavelengths above about 10.5 microns for comparative Sample C2, while significantly lower losses occur for Samples 6-8. Table 3 below gives values of the extinction coefficient (k) extracted from FIG. 10 for comparative Sample C2 and Sample 8 at selected wavelengths. Values are expressed in exponential notation where, for example, 3.50E-03 means $3.50 \times 10^{-3}$.

TABLE 3

| Values of Extinction Coefficient (k) for comparative Sample C2 and Sample 8 | | |
|---|---|---|
| Wavelength (microns) | Comparative Sample C2 | Sample 8 |
| 10.0 | 3.50E-03 | 0 |
| 10.5 | 7.60E-03 | 0 |
| 11.0 | 1.39E-02 | 0 |

TABLE 3-continued

| Values of Extinction Coefficient (k) for comparative Sample C2 and Sample 8 | | |
|---|---|---|
| Wavelength (microns) | Comparative Sample C2 | Sample 8 |
| 11.5 | 2.09E-02 | 0 |
| 12.0 | 2.85E-02 | 1.12E-05 |
| 12.5 | 3.51E-02 | 1.03E-03 |
| 13.0 | 4.21E-02 | 2.70E-03 |
| 13.5 | 4.75E-02 | 4.50E-03 |
| 14.0 | 5.07E-02 | 6.40E-03 |
| 14.5 | 5.04E-02 | 8.30E-03 |
| 15.0 | 4.64E-02 | 1.04E-02 |

The results presented in FIG. 10 and Table 3 indicate that a layer of $YbF_3$ according to embodiments herein has an extinction coefficient less than 0.0400, or less than 0.0350, or less than 0.0300, or less than 0.0250, or less than 0.0200, or less than 0.0150, or less than 0.0100, or less than 0.0050 at a wavelength of 13.5 microns. The results presented in FIG. 10 further indicate that a layer of $YbF_3$ according to embodiments herein has an extinction coefficient less than 0.0100, or less than 0.0075, or less than 0.0050, or less than 0.0025 at a wavelength of 6.1 microns. The results presented in FIG. 10 further indicate that a layer of $YbF_3$ according to embodiments herein has an extinction coefficient less than 0.0200, or less than 0.0150, or less than 0.0100, or less than 0.0075, or less than 0.0050, or less than 0.0025 at a wavelength of 3.0 microns.

Embodiment Examples—Anti-Reflection Coatings Containing $YbF_3$

Figure 11:
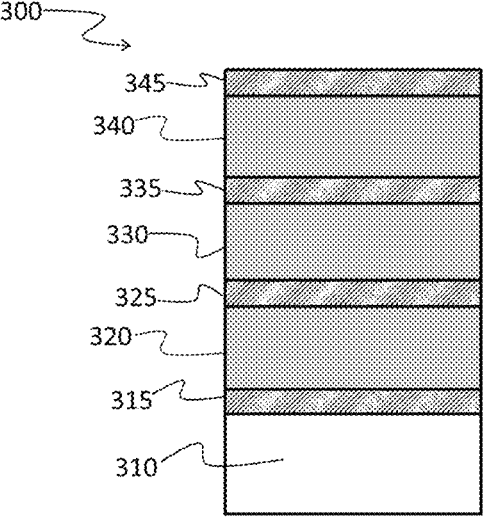
FIG. 11 shows an embodiment of an optical element that includes an anti-reflection coating disposed on a substrate.

The following examples compare optical elements consisting of a substrate and an anti-reflection coating. The substrate was ZnSe with a diameter of 1 inch and a thickness of 3 mm. The anti-reflection coating included a stack of alternating high and low index layers. The high index layer was ZnSe and the low index layer was $YbF_3$. The optical element is depicted schematically in FIG. 11. Optical element 300 includes ZnSe substrate 310; $YbF_3$ layers 315, 325, 335, and 345; and ZnSe layers 320, 330, and 340. For convenience of illustration, the different $YbF_3$ layers are shown as having equal thickness. In practice, the different $YbF_3$ layers may have the same or different thicknesses. Similarly, the different ZnSe layers are depicted as having equal thickness. In practice, the different ZnSe layers may have the same or different thicknesses.

Two different optical elements (300A, 300B) were prepared. The deposition conditions used for each of the ZnSe layers were the same for optical elements 300A and 300B. Each ZnSe layer in each of optical elements 300A and 300B was deposited by the resistive heating evaporation technique described above. The thickness of the ZnSe layers differed within each optical element and between the two optical elements (see FIGS. 12 and 13). The ZnSe substrate in both optical element 300A and optical element 300B are denoted by the label 310 in FIGS. 12 and 13. The ZnSe layers in both optical element 300A and optical element 300B are denoted by the labels 320, 330, and 340 in FIGS. 12 and 13. Optical element 300B includes an additional ZnSe layer 350.

The IAD deposition conditions for the $YbF_3$ layers differed for optical element 300A and optical element 300B. Conventional IAD conditions were used to form the $YbF_3$ layers in optical element 300A. In the conventional IAD conditions, the ion source was operated at an ion current of 6 A and a voltage of 75 V. Modified IAD conditions were used to form the YbF$_3$ layers in optical element 300B. In the modified IAD conditions, the ion source was operated at an ion current of 10 A and a voltage of 150 V. The thickness of the YbF$_3$ layers differed within each optical element and between the two optical elements (see FIGS. 12 and 13). To distinguish YbF$_3$ layers made under the conventional and modified IAD deposition conditions, the YbF$_3$ layers of optical element 300A are referred to by the labels 315A, 325A, 335A, and 345A, and the YbF$_3$ layers of optical element 300B are referred to by the labels 315B, 325B, 335B, 345B, and 355B.

Figure 12:
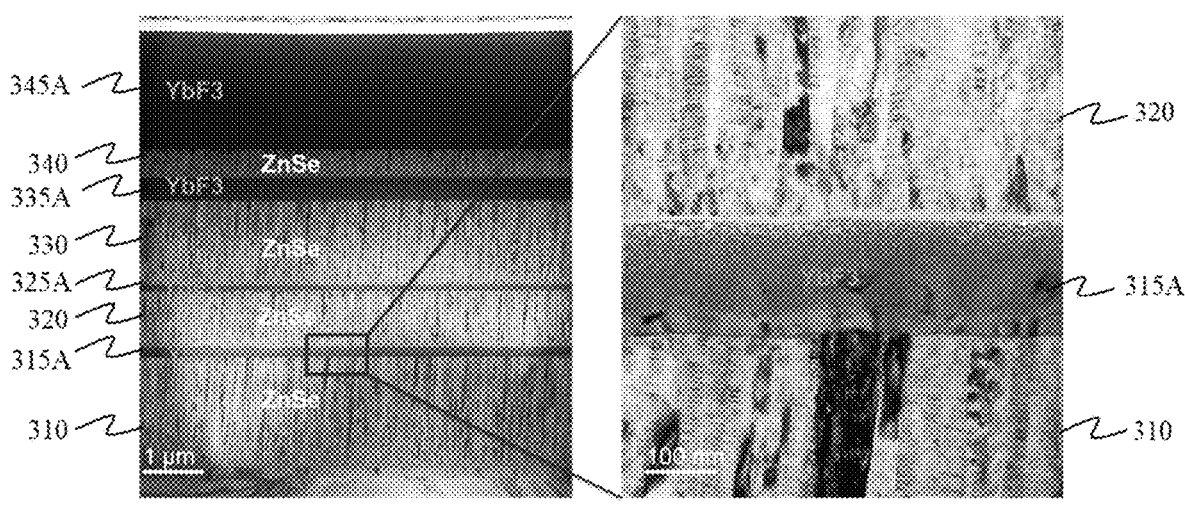
FIG. 12 shows a cross-sectional TEM (transmission electron microscopy) image of an optical element that includes $YbF_3$ layers formed by a conventional IAD process.
Figure 13:
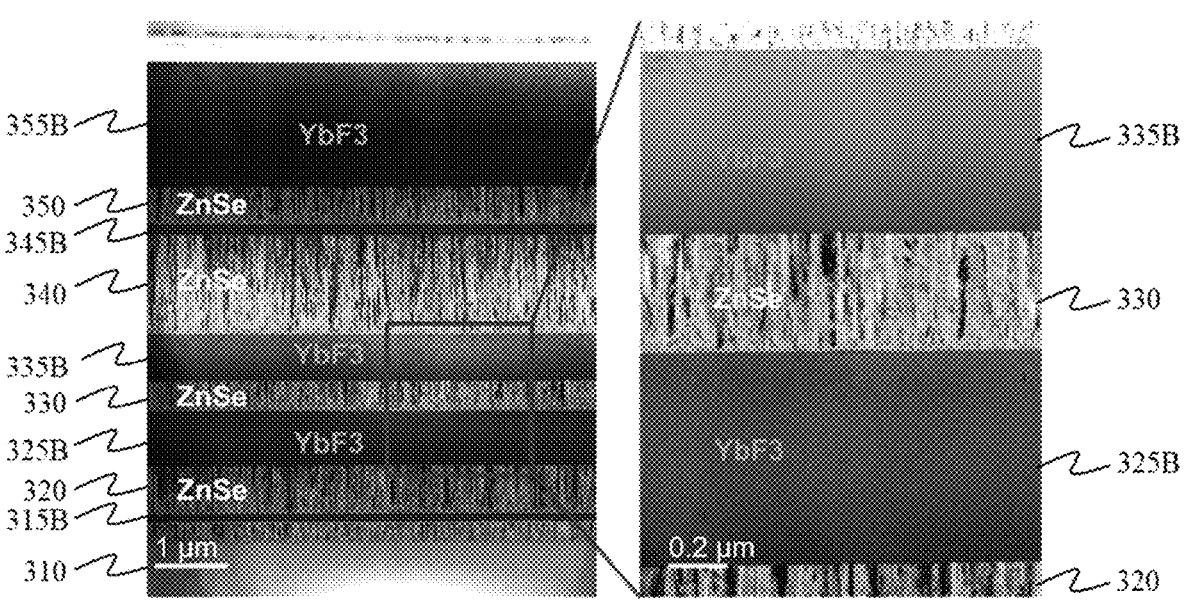
FIG. 13 shows a cross-sectional TEM image of an optical element that includes $YbF_3$ layers formed by a modified IAD process according to embodiments described herein.

FIG. 12 shows a cross-sectional TEM image of optical element 300A and an enlargement of a portion thereof. FIG. 13 shows a cross-sectional TEM image of optical element 300B and an enlargement of a portion thereof. The note-worthy distinction between optical elements 300A and 300B is in the quality of the YbF$_3$ layers. The YbF$_3$ layers of optical element 300A exhibited defects, phase segregation, and porosity (see, for example, the enlargement of YbF$_3$ layer 315A in FIG. 12), while the YbF$_3$ layers of optical element 300B were dense, smooth, and essentially void of defects and phase segregation (see, for example, the enlarge-ment of YbF$_3$ layers 325B and 335B in FIG. 13).

Figure 14:
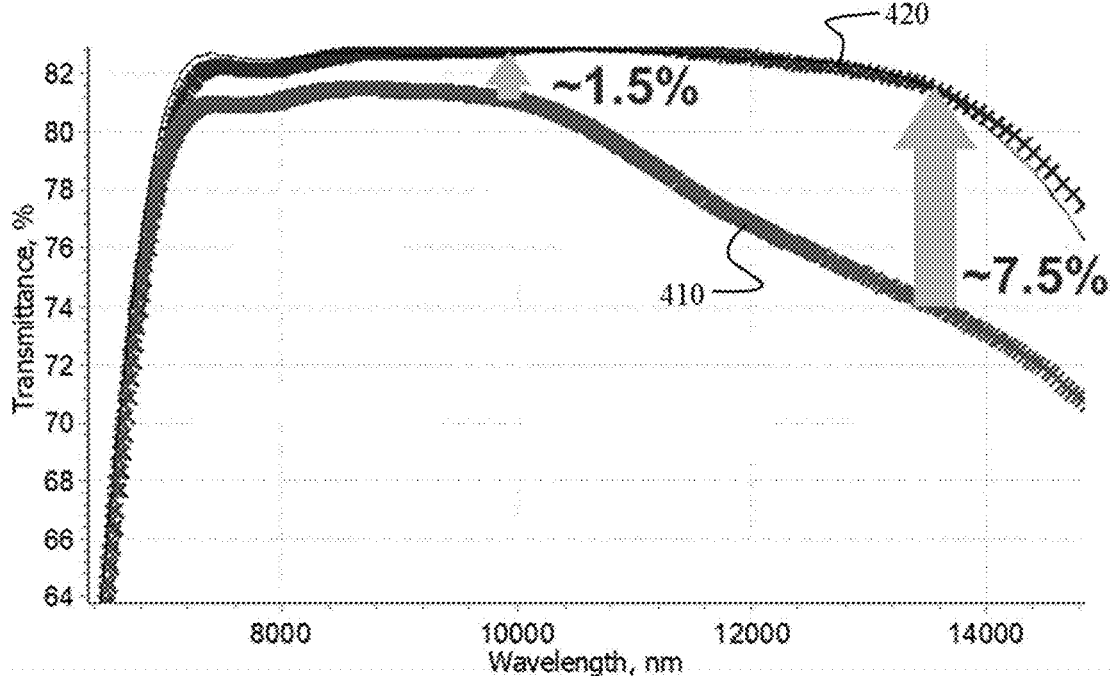
FIG. 14 compares transmittance as a function of wavelength in the LWIR region for an optical element that includes $YbF_3$ layers made by conventional IAD and an optical element that includes $YbF_3$ layers made by modified IAD.

FIG. 14 illustrates the effect of IAD conditions on trans-mittance in the LWIR region. Trace 410 shows the trans-mittance as a function of wavelength for optical element 300A. The data indicate a significant decrease in transmit-tance at wavelengths above 10.0 microns. The decrease in transmittance is attributed to the defects associated with the poor quality of YbF$_3$ layers produced under conventional IAD conditions in optical element 300A. Trace 420 shows the transmittance as a function of wavelength for an optical element corresponding to a modification of optical element 300A in which the YbF$_3$ layers were prepared with the modified IAD conditions used to form the YbF$_3$ layers of optical element 300B. Except for the IAD conditions used to form the YbF$_3$ layers, the optical elements represented by Traces 410 and 420 were identical. Trace 420 demonstrates that use of modified IAD conditions to form the YbF$_3$ layers led to a significant increase in transmittance in the LWIR region. The increase was particular pronounced for wave-lengths above 10.0 microns, where, for example, an increase in transmittance of about 7.5% (from about 74% to about 81.5%) was observed at a wavelength of 13.5 microns.

Figure 15:
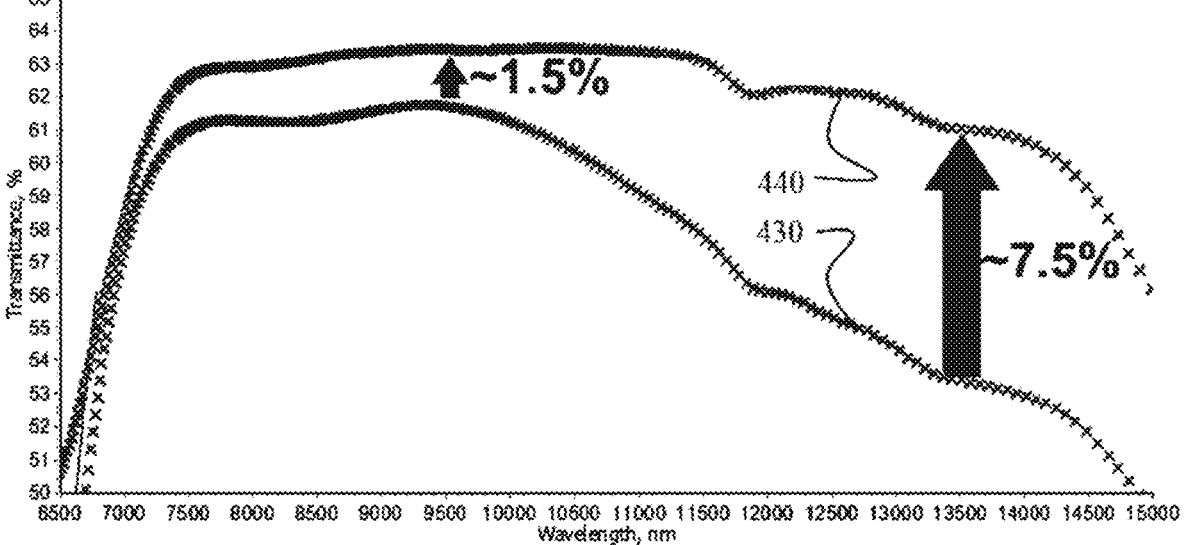
FIG. 15 compares transmittance as a function of wavelength in the LWIR region for an optical element that includes $YbF_3$ layers made by conventional IAD and an optical element that includes $YbF_3$ layers made by modified IAD.
Figure 16:
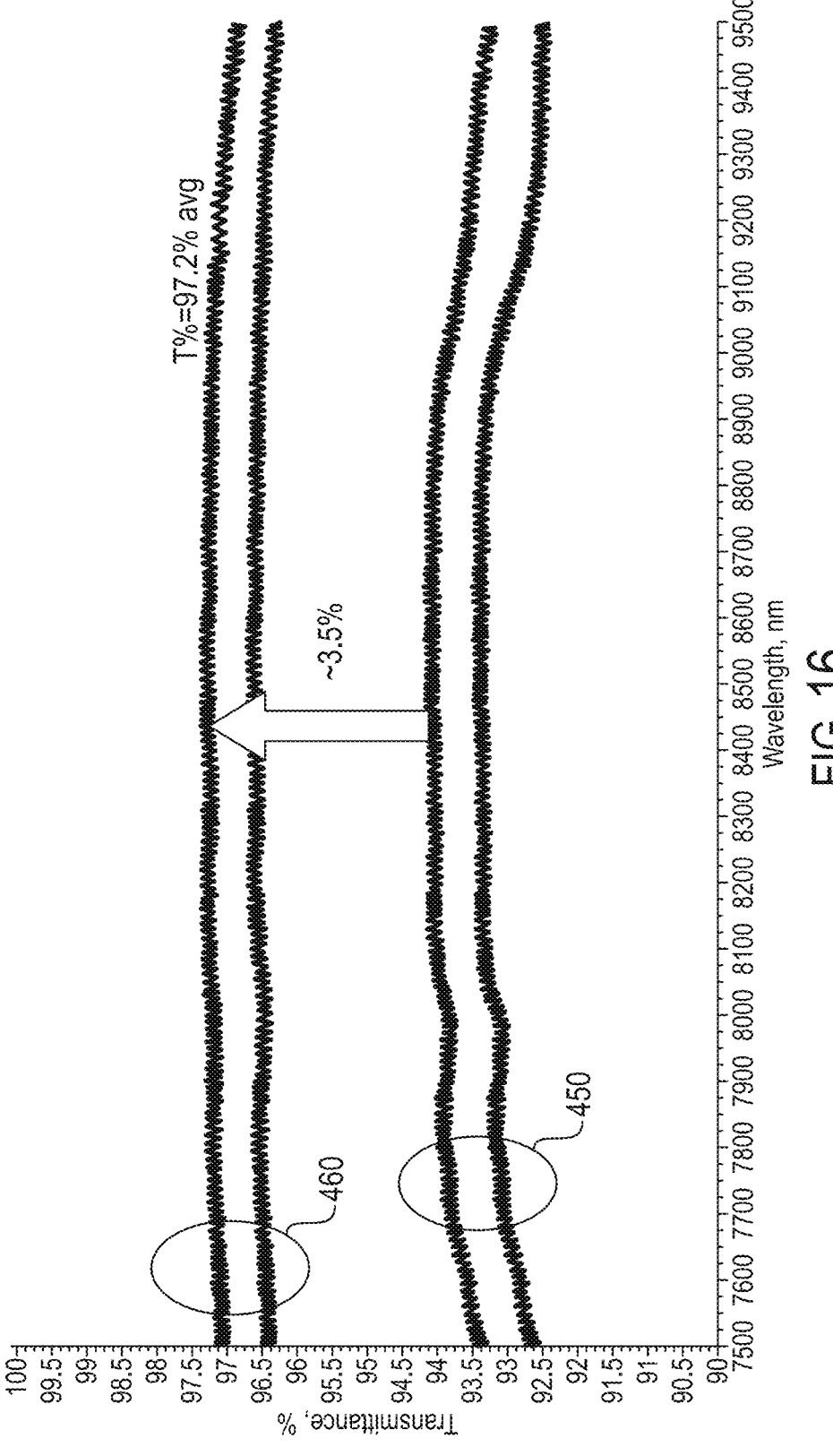
FIG. 16 compares transmittance as a function of wavelength in the LWIR region for optical elements that includes $YbF_3$ layers made by conventional IAD and optical elements that includes $YbF_3$ layers made by modified IAD.

FIGS. 15 and 16 show similar improvements in transmit-tance in the LWIR region for anti-reflection coatings on alternative substrates. The anti-reflection coatings were similar to the one depicted schematically in FIG. 11 and included alternating layers of ZnSe and YbF$_3$. The ZnSe layers of the optical elements depicted in FIGS. 15 and 16 were made by evaporation of a ZnSe source material by resistive heating as described above. The YbF$_3$ layers in one of the optical elements depicted in FIG. 15 and two of the optical elements depicted in FIG. 16 were made using IAD under the conventional IAD conditions described above (ion current=6 A, voltage=75 V). The YbF$_3$ layers in the other of the optical elements depicted in each of FIGS. 15 and 16 were made using IAD under the modified IAD conditions described above (ion current=10 A, voltage=150 V).

FIG. 15 compares the effect of IAD conditions on trans-mittance in the LWIR region for an optical element consist-ing of a YbF$_3$/ZnSe anti-reflection coating (5 layers of YbF$_3$/4 layers of ZnSe) on a Ge substrate. Trace 430 shows the result for an optical element in which conventional IAD conditions were used to deposit the YbF$_3$ layers. Trace 440 shows the result for an optical element in which modified IAD conditions were used to deposit the YbF$_3$ layers. As was observed for the ZnSe substrate, a significant improvement in transmittance in the LWIR region was observed for the anti-reflection coating on the Ge substrate. FIG. 16 shows a similar result (measured at 77 K) for two optical elements consisting of a YbF$_3$/ZnSe anti-reflection coating (5 layers of YbF$_3$/5 layers of ZnSe) on a InSb substrate. Since the InSb substrate itself absorbs strongly above a wavelength of about 9.5 microns, transmittance data is shown for a portion of the LWIR region below 9.5 microns (9500 nm). Traces 450 show transmittance as a function of wavelength for two optical elements in which conventional IAD conditions were used to form the YbF$_3$ layers. Traces 460 show transmittance as a function of wavelength for the same two optical elements using modified IAD conditions to form the YbF$_3$ layers. A significant improvement in transmittance was observed in the wavelength range from 7.5 microns (7500 nm) to 9.5 microns (9500 nm).

The results depicted herein indicate that improved per-formance (e.g. lower absorption and/or higher transmittance and/or lower reflectance) of YbF$_3$ (either as a single layer or as a layer within a multilayer stack such as an anti-reflection coating) in the LWIR is achievable using the modified IAD method disclosed herein. Modified IAD is preferably per-formed at an ion source voltage greater than 130 V, or greater than 140 V, or greater than 150 V, or greater than 160 V, or greater than 170 V, or greater than 190 V, or greater than 210 V, or greater than 230 V, or in the range from 125 V to 400 V, or in the range from 130 V to 350 V, or in the range from 135 V to 300 V, or in the range from 140 V to 275 V, or in the range from 145 V to 250 V, or in the range from 150 V to 225 V, or in the range from 125 V to 200 V, or in the range from 130 V to 190 V, or in the range from 135 V to 185 V, or in the range from 140 V to 180 V. The ion current for any of the foregoing voltage ranges extends over the range of current available from the ion source. Common ion sources are capable of operating at ion currents in the range from 1 mA (milliamp) to 10 A. Representative ranges for the ion current include a current in the range from 1 mA to 10 A, or in the range from 10 mA to 9 A, or in the range from 25 mA to 8 A, or in the range from 50 mA to 7 A, or in the range from 75 mA to 6 A, or in the range from 100 mA to 5 A, or in the range from 250 mA to 4 A. Other representative ion currents include ion currents greater than 0.5 A, or greater than 1 A, or greater than 2 A, or greater than 4 A, or greater than 6 A, or greater than 8 A, or in the range from 0.5 A to 20 A, or in the range from 1 A to 15 A, or in the range from 2 A to 10 A, or in the range from 3 A to 9 A, or in the range from 4 A to 8 A.

The results depicted herein demonstrate optical elements having a transmittance at a wavelength of 13.5 microns of greater than 60%, or greater than 65%, or greater than 70%, or greater than 75%, or greater than 80%, or in the range from 60% to 90%, or in the range from 65% to 90%, or in the range from 70% to 90%, or in the range from 75% to 90%, or in the range from 80% to 90%, or in the range from 75% to 85%.

Aspect 1 of the description is:
An optical element comprising:
a substrate; and
a coating in contact with the substrate, the coating com-prising a layer of YbF$_3$, the layer of YbF$_3$ having an absorption less than 2.2%/micron at a wavelength of 13.5 microns.

Aspect 2 of the description is:
The optical element of Aspect 1, wherein the substrate is selected from the group consisting of ZnS, ZnSe, Ge, InSb, chalcogenide glasses, $As_{40}Se_{60}$, $Ge_{10}Se_{50}As_{40}$, $Ge_{28}Sb_{12}Se_{60}$, and $Ge_{33}Se_{55}As_{12}$.

Aspect 3 of the description is:

The optical element of any of Aspects 1-2, wherein the substrate comprises ZnSe, Ge, or InSb.

Aspect 4 of the description is:

The optical element of any of Aspects 1-3, wherein the coating comprises a plurality of the layers of $YbF_3$.

Aspect 5 of the description is:

The optical element of any of Aspects 1-4, wherein the coating further comprises a second layer in direct contact with the layer of $YbF_3$, the second layer having a higher refractive index than the layer of $YbF_3$.

Aspect 6 of the description is:

The optical element of Aspect 5, wherein the coating comprises a plurality of the second layers and a plurality of the layer of $YbF_3$.

Aspect 7 of the description is:

The optical element of Aspect 6, wherein the plurality of second layers and the plurality of layers of $YbF_3$ are arranged as an alternating sequence.

Aspect 8 of the description is:

The optical element of any of Aspects 1-7, wherein the layer of $YbF_3$ has an absorption less than 1.9%/micron at a wavelength of 13.5 microns.

Aspect 9 of the description is:

The optical element of any of Aspects 1-7, wherein the layer of $YbF_3$ has an absorption less than 1.5%/micron at a wavelength of 13.5 microns.

Aspect 10 of the description is:

The optical element of any of Aspects 1-9, wherein the layer of $YbF_3$ has an absorption less than 0.8%/micron at a wavelength of 10.5 microns.

Aspect 11 of the description is:

The optical element of any of Aspects 1-9, wherein the layer of $YbF_3$ has an absorption less than 0.4%/micron at a wavelength of 10.5 microns.

Aspect 12 of the description is:

The optical element of any of Aspects 1-11, wherein the layer of $YbF_3$ has an absorption less than 0.8%/micron at a wavelength of 7.5 microns.

Aspect 13 of the description is:

The optical element of any of Aspects 1-11, wherein the layer of $YbF_3$ has an absorption less than 0.4%/micron at a wavelength of 7.5 microns.

Aspect 14 of the description is:

The optical element of any of Aspects 1-13, wherein the layer of $YbF_3$ has an extinction coefficient less than 0.0400 at a wavelength of 13.5 microns.

Aspect 15 of the description is:

The optical element of any of Aspects 1-13, wherein the layer of $YbF_3$ has an extinction coefficient less than 0.0200 at a wavelength of 13.5 microns.

Aspect 16 of the description is:

The optical element of any of Aspects 1-15, wherein the layer of $YbF_3$ has an extinction coefficient less than 0.0100 at a wavelength of 6.1 microns.

Aspect 17 of the description is:

The optical element of any of Aspects 1-15, wherein the layer of $YbF_3$ has an extinction coefficient less than 0.0050 at a wavelength of 6.1 microns.

Aspect 18 of the description is:

The optical element of any of Aspects 1-17, wherein the layer of $YbF_3$ has an extinction coefficient less than 0.0200 at a wavelength of 3.0 microns.

Aspect 19 of the description is:

The optical element of any of Aspects 1-17, wherein the layer of $YbF_3$ has an extinction coefficient less than 0.0100 at a wavelength of 3.0 microns.

Aspect 20 of the description is:

The optical element of any of Aspects 1-19, wherein the optical element has a transmittance greater than 60% at a wavelength of 13.5 microns.

Aspect 21 of the description is:

The optical element of any of Aspects 1-19, wherein the optical element has a transmittance greater than 80% at a wavelength of 13.5 microns.

Aspect 22 of the description is:

A method of making an optical element comprising:

forming a fluoride layer on a substrate, the forming comprising depositing the fluoride layer using an ion-assisted deposition process, the ion-assisted deposition process comprising subjecting a source material for the fluoride layer to an ion source, the ion source configured to operate at a voltage greater than 120 V.

Aspect 23 of the description is:

The method of Aspect 22, wherein the fluoride layer comprises $YbF_3$.

Aspect 24 of the description is:

The method of any of Aspects 22-23, wherein substrate is selected from the group consisting of ZnS, ZnSe, Ge, InSb, chalcogenide glasses, $As_{40}Se_{60}$, $Ge_{10}Se_{50}As_{40}$, $Ge_{28}Sb_{12}Se_{60}$, and $Ge_{33}Se_{55}As_{12}$.

Aspect 25 of the description is:

The method of any of Aspects 22-24, wherein the substrate is ZnSe, Ge, or InSb.

Aspect 26 of the description is:

The method of any of Aspects 22-25, wherein the ion source is configured to operate at a voltage greater than 130 V.

Aspect 27 of the description is:

The method of any of Aspects 22-25, wherein the ion source is configured to operate at a voltage greater than 140 V.

Aspect 28 of the description is:

The method of any of Aspects 22-25, wherein the ion source is configured to operate at a voltage greater than 150 V.

Aspect 29 of the description is:

The method of any of Aspects 22-25, wherein the ion source is configured to operate at a voltage greater than 160 V.

Aspect 30 of the description is:

The method of any of Aspects 22-25, wherein the ion source is configured to operate at a voltage in a range from 140 V to 180 V.

Aspect 31 of the description is:

The method of any of Aspects 22-30, wherein the ion source is configured to operate at an ion current in a range from 1 mA to 10 A.

Many variations and modifications may be made to the above-described embodiments of the disclosure without departing substantially from the spirit and various principles of the disclosure. All such modifications and variations are intended to be included herein within the scope of this disclosure and protected by the following claims.

To the extent not already described, the different features of the various aspects of the present disclosure may be used in combination with each other as desired. That a particular feature is not explicitly illustrated or described with respect to each aspect of the present disclosure is not meant to be construed that it cannot be, but it is done for the sake of brevity and conciseness of the description. Thus, the various features of the different aspects may be mixed and matched as desired to form new aspects, whether or not the new aspects are expressly disclosed.

What is claimed is:

1. An optical element comprising:
a substrate; and
a coating in contact with the substrate, the coating comprising a layer of $YbF_3$, the layer of $YbF_3$ having an absorption less than 2.2%/micron at a wavelength of 13.5 microns.

2. The optical element of claim 1, wherein the substrate is selected from the group consisting of ZnS, ZnSe, Ge, InSb, chalcogenide glasses, $As_{40}Se_{60}$, $Ge_{10}Se_{50}As_{40}$, $Ge_{28}Sb_{12}Se_{60}$, and $Ge_{33}Se_{55}As_{12}$.

3. The optical element of claim 1, wherein the substrate comprises ZnSe, Ge, or InSb.

4. The optical element of claim 1, wherein the coating comprises a plurality of the layers of $YbF_3$.

5. The optical element of claim 1, wherein the coating further comprises a second layer in direct contact with the layer of $YbF_3$, the second layer having a higher refractive index than the layer of $YbF_3$.

6. The optical element of claim 5, wherein the coating comprises a plurality of the second layers and a plurality of the layer of $YbF_3$.

7. The optical element of claim 6, wherein the plurality of second layers and the plurality of layers of $YbF_3$ are arranged as an alternating sequence.

8. The optical element of claim 1, wherein the layer of $YbF_3$ has an absorption less than 1.9%/micron at a wavelength of 13.5 microns.

9. The optical element of claim 1, wherein the layer of $YbF_3$ has an absorption less than 0.8%/micron at a wavelength of 10.5 microns.

10. The optical element of claim 1, wherein the layer of $YbF_3$ has an absorption less than 0.8%/micron at a wavelength of 7.5 microns.

11. The optical element of claim 1, wherein the layer of $YbF_3$ has an extinction coefficient less than 0.0400 at a wavelength of 13.5 microns.

12. The optical element of claim 1, wherein the layer of $YbF_3$ has an extinction coefficient less than 0.0100 at a wavelength of 6.1 microns.

13. The optical element of claim 1, wherein the layer of $YbF_3$ has an extinction coefficient less than 0.0200 at a wavelength of 3.0 microns.

14. The optical element of claim 1, wherein the optical element has a transmittance greater than 80% at a wavelength of 13.5 microns.

15. The optical element of claim 5, wherein the second layer comprises ZnS or ZnSe.

* * * * *